(12) United States Patent
Deng

(10) Patent No.: US 10,361,165 B2
(45) Date of Patent: Jul. 23, 2019

(54) MICROELECTRONIC SUBSTRATE HAVING EMBEDDED TRACE LAYERS WITH INTEGRAL ATTACHMENT STRUCTURES

(71) Applicant: INTEL CORPORATION, Santa Clara, CA (US)

(72) Inventor: Yikang Deng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/485,092

(22) Filed: Apr. 11, 2017

(65) Prior Publication Data

US 2017/0221847 A1 Aug. 3, 2017

Related U.S. Application Data

(62) Division of application No. 14/681,445, filed on Apr. 8, 2015, now Pat. No. 9,653,419.

(51) Int. Cl.
*H01L 21/48* (2006.01)
*H01L 23/00* (2006.01)
*H01L 23/498* (2006.01)

(52) U.S. Cl.
CPC ............ *H01L 24/13* (2013.01); *H01L 21/486* (2013.01); *H01L 23/49811* (2013.01); *H01L 23/49827* (2013.01); *H01L 23/49866* (2013.01); *H01L 24/81* (2013.01); *H01L 2224/13009* (2013.01); *H01L 2224/13022* (2013.01); *H01L 2224/1357* (2013.01); *H01L 2224/13111* (2013.01); *H01L 2224/13116* (2013.01); *H01L 2224/13147* (2013.01); *H01L 2224/13553* (2013.01);

(Continued)

(58) Field of Classification Search
USPC ......................................... 438/613; 257/737
See application file for complete search history.

(56) References Cited

U.S. PATENT DOCUMENTS 4,857,481 A 8/1989 Tam et al.
5,316,974 A 5/1994 Crank
(Continued)

FOREIGN PATENT DOCUMENTS

EP 1930946 6/2008
KR 10-2011-0060921 A 6/2011
(Continued)

OTHER PUBLICATIONS

International Search Report and Written Opinion received for PCT Patent Application No. PCT/US2016/021176, dated Jun. 24, 2016, 12 pages.

(Continued)

*Primary Examiner* — Timor Karimy
(74) *Attorney, Agent, or Firm* — Green, Howard & Mughal LLP.

(57) ABSTRACT

A microelectronic substrate may be formed to have an embedded trace which includes an integral attachment structure that extends beyond a first surface of a dielectric layer of the microelectronic substrate for the attachment of a microelectronic device. In one embodiment, the embedded trace may be fabricated by forming a dummy layer, forming a recess in the dummy layer, conformally depositing surface finish in the recess, forming an embedded trace layer on the dummy layer and abutting the surface finish, and removing the dummy layer.

14 Claims, 7 Drawing Sheets

(52) U.S. Cl.
CPC ............... *H01L 2224/81801* (2013.01); *H01L 2924/014* (2013.01)

(56) References Cited

U.S. PATENT DOCUMENTS

| | | | |
|---|---|---|---|
| 6,156,651 | A | 12/2000 | Havemann |
| 2002/0086518 | A1 | 7/2002 | Asami |
| 2010/0044860 | A1* | 2/2010 | Haba ................. H01L 23/49811 257/737 |
| 2011/0042794 | A1 | 2/2011 | Hsieh et al. |
| 2012/0161330 | A1 | 6/2012 | Hlad et al. |
| 2013/0122216 | A1* | 5/2013 | Tarng ..................... B32B 17/04 427/555 |
| 2013/0175699 | A1* | 7/2013 | Haba ....................... H01L 24/20 257/774 |
| 2014/0252598 | A1* | 9/2014 | Yu ..................... H01L 23/49838 257/737 |
| 2015/0035160 | A1 | 2/2015 | Sutardja et al. |

FOREIGN PATENT DOCUMENTS

| | | |
|---|---|---|
| WO | 2001056078 | 8/2001 |
| WO | 2012/067992 A2 | 5/2012 |

OTHER PUBLICATIONS

Notice of Allowance for U.S. Appl. No. 14/681,445, dated Feb. 8, 2017.
Office Action for U.S. Appl. No. 14/681,445, dated Sep. 15, 2016.
Restriction Requirement for U.S. Appl. No. 14/681,445 dated May 20, 2016.
Search Report for Taiwan Patent Application No. 105106888, dated Apr. 24, 2017.
Notice of Allowance for Taiwan Patent Application No. 105106888, dated Mar. 27, 2018.
Partial Supplementary European Search Report on European Patent Application No. 16777018.9, dated Dec. 12, 2018.
Extended European Search Report for European Patent Application No. 16777018.9, dated May 16, 2019.

* cited by examiner

MICROELECTRONIC SUBSTRATE HAVING EMBEDDED TRACE LAYERS WITH INTEGRAL ATTACHMENT STRUCTURES

RELATED APPLICATIONS

The present application is a divisional of U.S. patent application Ser. No. 14/681,445, filed on Apr. 8, 2015, entitled "MICROELECTRONIC SUBSTRATE HAVING EMBEDDED TRACE LAYERS WITH INTEGRAL ATTACHMENT STRUCTURES", which are hereby incorporated herein in their entirety and all purposes.

TECHNICAL FIELD

Embodiments of the present description generally relate to the field of microelectronic device fabrication, and, more particularly, to the fabrication of microelectronic substrates having embedded trace layers.

BACKGROUND

The microelectronic industry is continually striving to produce ever faster and smaller microelectronic devices for use in various electronic products, including, but not limited to portable products, such as portable computers, digital cameras, electronic tablets, cellular phones, and the like. An example of one such microelectronic device is a mobile chip scale package, which is well known in the art. Non-embedded trace substrates may be used in the formation of coreless substrates for such mobile chip scale packages. Non-embedded trace substrates are generally formed with modified semi-additive processes which result in protruding traces. However, such protruding traces may suffer from sidewall etching, as known to those skilled in the art. Thus, embedded trace substrates have become prevalent in the formation of coreless substrates for such chip scale packages. These embedded trace substrates can enable very fine line/space patterning, which can translate into high input/output density, compared with traditional non-embedded trace substrates due to the fact that embedded traces do not suffer from sidewall etching.

Although embedded trace substrates have further advantages, such as high trace reliability and good substrate surface flatness, they do present a key challenge with regard to misalignment during subsequent microelectronic device placement/attachment. This misalignment is due to the fact that the embedded traces may be recessed below surrounding dielectric material of the coreless substrate, which may cause such misalignment, as will be understood to those skilled in the art. Therefore, there is a need for a trace structure, which has the advantages of embedded traces without a risk of microelectronic device placement/attachment misalignment.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
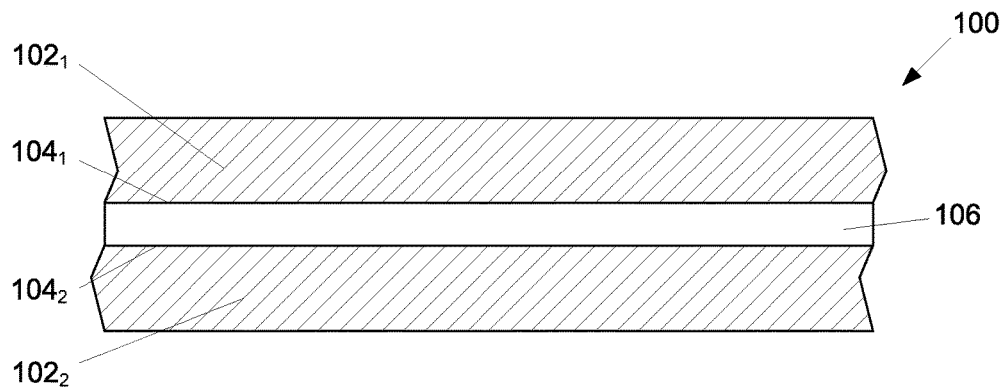
FIGS. 1-10 illustrate side cross sectional views of a method of forming a microelectronic substrate having an embedded trace with an integral attachment structure, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

For the purposes of the present description, the term "integral" is defined to mean that the components of a structure are formed with a single material without structural interfaces within the single material between the components.

Embodiments of the present description include a microelectronic substrate having an embedded trace which includes an integral attachment structure that extends beyond a first surface of a dielectric layer of the microelectronic substrate for the attachment of a microelectronic device. In one embodiment, the embedded trace may be fabricated by forming a dummy layer, forming a recess in the dummy layer, conformally depositing surface finish in the recess, forming an embedded trace layer on the dummy layer and abutting the surface finish, and removing the dummy layer.

FIGS. 1-10 illustrate a method of fabricating the microelectronic substrate having the embedded trace which includes the integral attachment structure. Although the fabrication process of FIGS. 1-10 illustrates the simultaneous fabrication of two microelectronic substrates on opposing surfaces of a temporary core, it is understood that a single microelectronic substrate could be formed in a like manner. Furthermore, although the fabrication process of FIGS. 1-10 illustrates the fabrication of "2-layer coreless structures", it is understand that any appropriate number of layers could be fabricated in a like manner with the addition of further dielectric layers and conductive vias/conductive traces, as will be understood to those skilled in the art.

As shown in FIG. 1, a laminated structure 100 may be formed comprising dummy layers $102_1$, $102_2$ on opposing sides $104_1$, $104_2$, respectively, of a temporary core 106. The temporary core 106 may be any appropriate substantially rigid material. The dummy layers $102_1$, $102_2$ may be any appropriate metal, including, but not limited to, copper, silver, nickel, gold, and the like. In a specific embodiment, the dummy layers $102_1$, $102_2$ may comprise copper, such as a copper foil.

Figure 2:
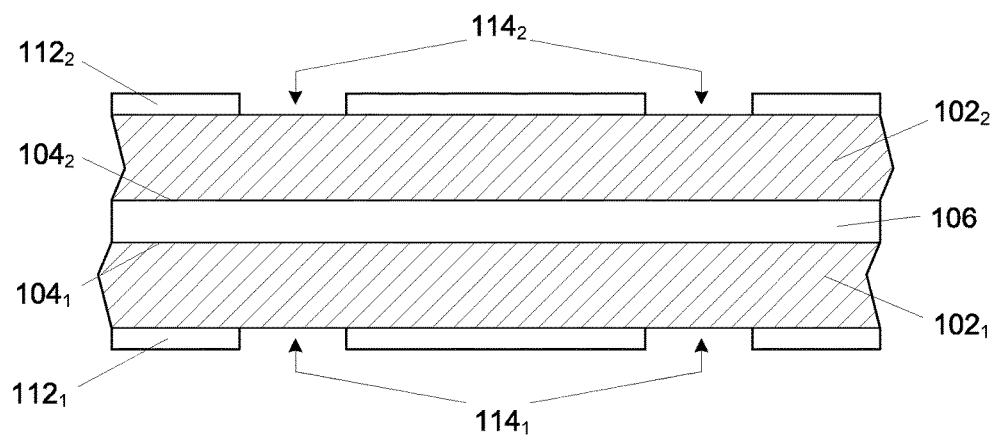

As shown in FIG. 2, etch masks $112_1$, $112_2$ may be formed on the dummy layers $102_1$, $102_2$, respectively. The etch masks $112_1$, $112_2$ may each have at least one opening $114_1$, $114_2$, respectively, therethrough, wherein the openings $114_1$, $114_2$ expose portions of the dummy layers $102_1$, $102_2$, respectively. The etch masks $112_1$, $112_2$ may be any appropriate mask material. In one embodiment, the etch masks $112_1$, $112_2$ may each be a dry film resist laminated on the dummy layers $102_1$, $102_2$, and the openings $114_1$, $114_2$ may be formed with a photolithographic process.

Figure 3:
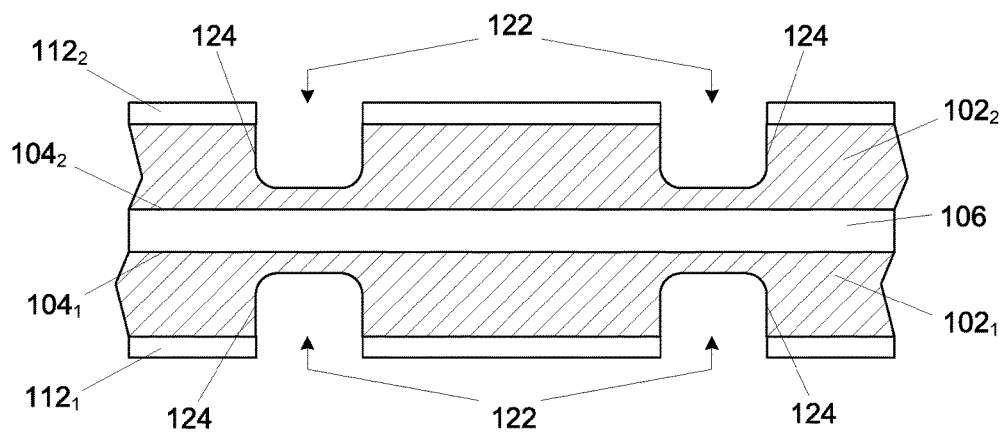

As shown in FIG. 3, recesses 122 may be etched into the dummy layer $102_1$, $102_2$ through the etch mask openings $114_1$, $114_2$ (see FIG. 2). The etching process used to form the recesses 122 may be any appropriate process, including, but not limited to, wet and dry etching processes. It is understood that the recesses 122 may be formed by other processes, which may or may not require etch masks $112_1$, $112_2$, such as laser ablation and ion bombardment.

Figure 4:
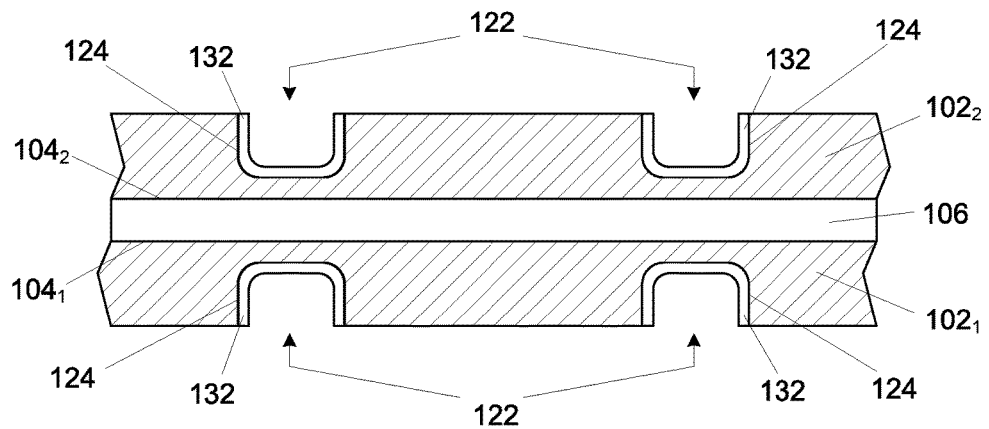

As shown in FIG. 4, a surface finish 132 may be substantially conformally deposited on surfaces 124 of the recesses 122 and the etch masks $112_1$, $112_2$ removed. The surface finish 132 may include a plurality of layers (not shown), such as a barrier layer for electro-migration resistance (for example, a palladium layer), a ductile layer (for example, a nickel layer), and/or an oxidation resistant/solder wetting layer (for example, a gold layer). The processes and materials used for forming surface finishes 132 are well known to those skilled in the art, and for the sake of brevity and conciseness will not be described or illustrated herein.

Figure 5:
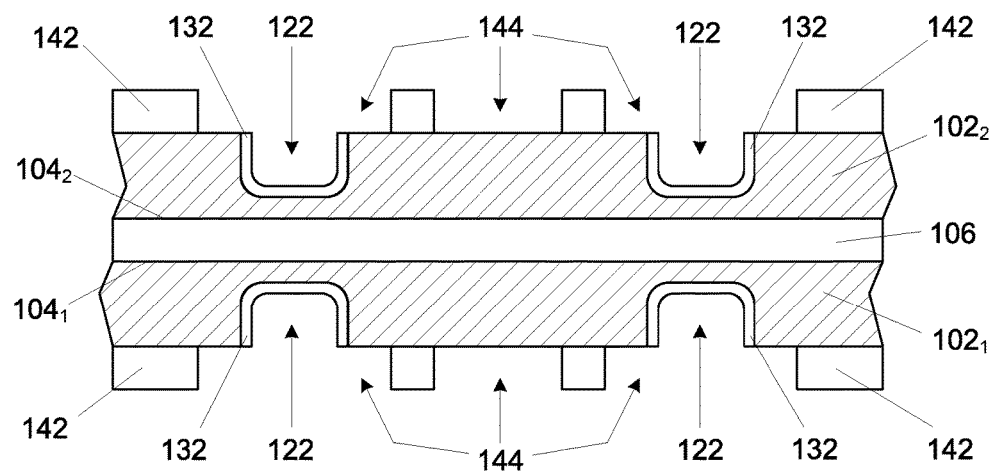

As shown in FIG. 5, embedded trace masks 142 may be formed on the dummy layer $102_1$, $102_2$. The embedded trace masks 142 include openings 144, which are patterned to place embedded traces in desired locations, as will be discussed. In one embodiment, the embedded traces masks 142 may each be a dry film resist laminated on the dummy layers $102_1$, $102_2$, and the openings 144 may be formed with a photolithographic process.

Figure 6:
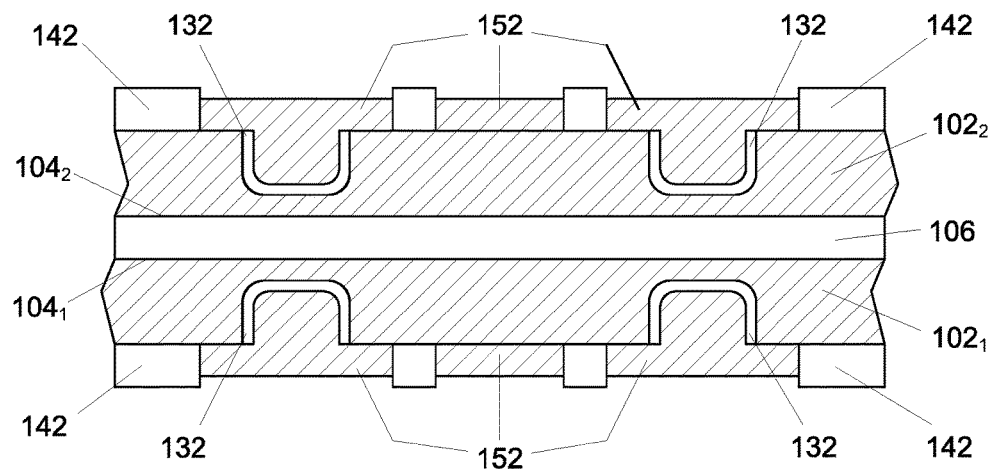

As shown in FIG. 6, embedded trace layers 152 may be formed to abut the dummy layers $102_1$, $102_2$ and the associated surface finishes 132. In embodiment, the embedded trace layers 152 may be any appropriate metal, including, but not limited to, copper, silver, nickel, gold, and the like. In one embodiment, when the embedded trace layer 152 is formed from a metal, it may be deposited with a plating process. In a specific embodiment, the embedded trace layers 152 may comprise copper.

Figure 7:
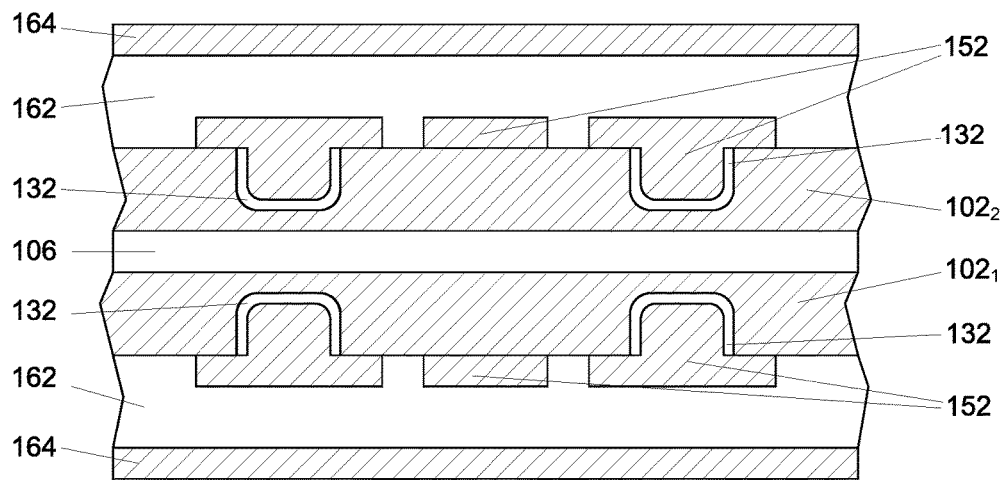

As shown in FIG. 7, the embedded trace masks 142 (see FIG. 6) may be removed and dielectric material layers 162 may be formed on the embedded trace layers 152 and the dummy layers $102_1$, $102_2$, and conductive layers 164 may be formed on the dielectric material layers 162. In one embodiment, the dielectric material layers 162 may be formed from any appropriate dielectric material including, but not limited to, silicon dioxide ($SiO_2$), silicon oxynitride ($SiO_xN_y$), and silicon nitride ($Si_3N_4$) and silicon carbide (SiC), liquid crystal polymer, epoxy resin, bismaleimide triazine resin, polyimide materials, and the like. In another embodiment, the conductive layer 164 may include any appropriate metal, such as copper. In a further embodiment, the conductive layer 164 and corresponding dielectric material layers 162 may comprise a prepreg structure, as known in the art, which is laminated on the embedded trace layers 152 and the dummy layers $102_1$, $102_2$.

Figure 8:
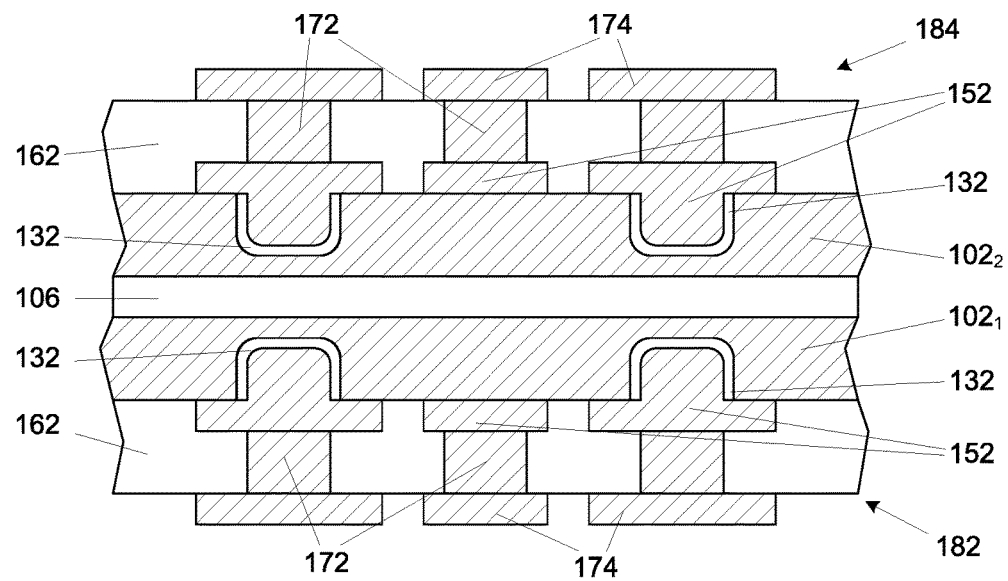

As shown in FIG. 8, conductive vias 172 may be formed through the dielectric material layers 162 to contact the embedded trace layer 152 and the conductive layers 164 (see FIG. 7) may be patterned to form conductive traces 174, thereby forming a first microelectronic panel 182 and a second microelectronic panel 184. In one embodiment, the conductive vias 172 may be formed by laser drilling followed by a plating process. In another embodiment, the conductive traces 174 may be formed by a photolithographic process.

Figure 9:
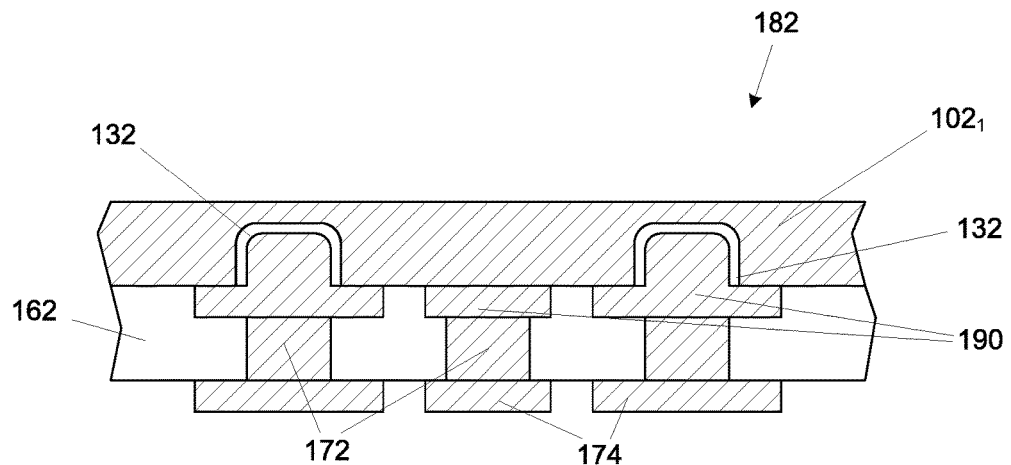
Figure 10:
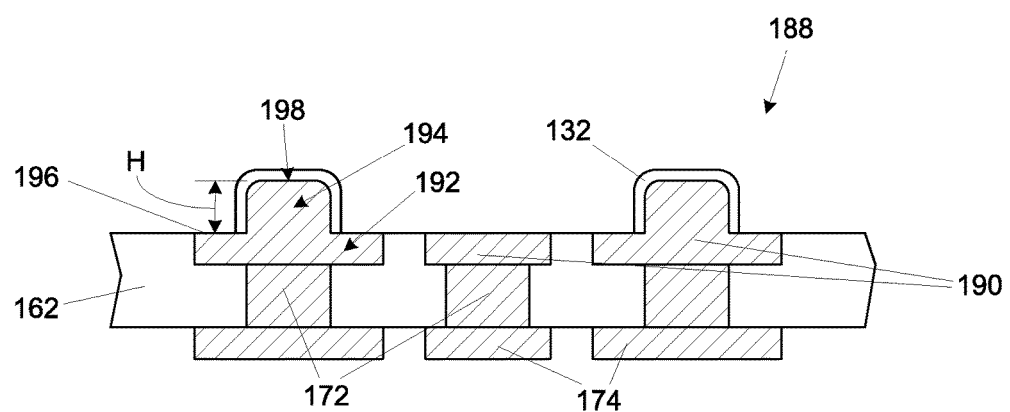

The first microelectronic panel 182 and the second microelectronic panel 184 may be separated from the temporary core 106, wherein the first microelectronic panel 182 is illustrated in FIG. 9 after separation. As shown in FIG. 10, the dummy layer $102_1$ (see FIG. 9) may be removed, such as by etching, to form a microelectronic substrate 188 and at least one embedded trace 190 comprising a planar portion 192 and an attachment structure 194 integral with and extending from a first surface 196 of the embedded trace planar portion 192. In one embodiment, when an etching process is used to remove the dummy layer $102_1$, the etching process should be selective to the surface finish 132, as will be understood to those skilled in the art.

Although it is conceivable that a non-integral attachment structure could be added to an embedded trace, the formation of the embedded trace 190 with the integral attachment structure 194 may be structurally advantageous, as no interface is formed between the embedded trace planar portion 192 and the attachment structure 194, and may be a simpler overall process, as forming an attachment structure after the formation of an embedded trace would requirement additional lithographic, etchings, and plating processes.

Figure 11:
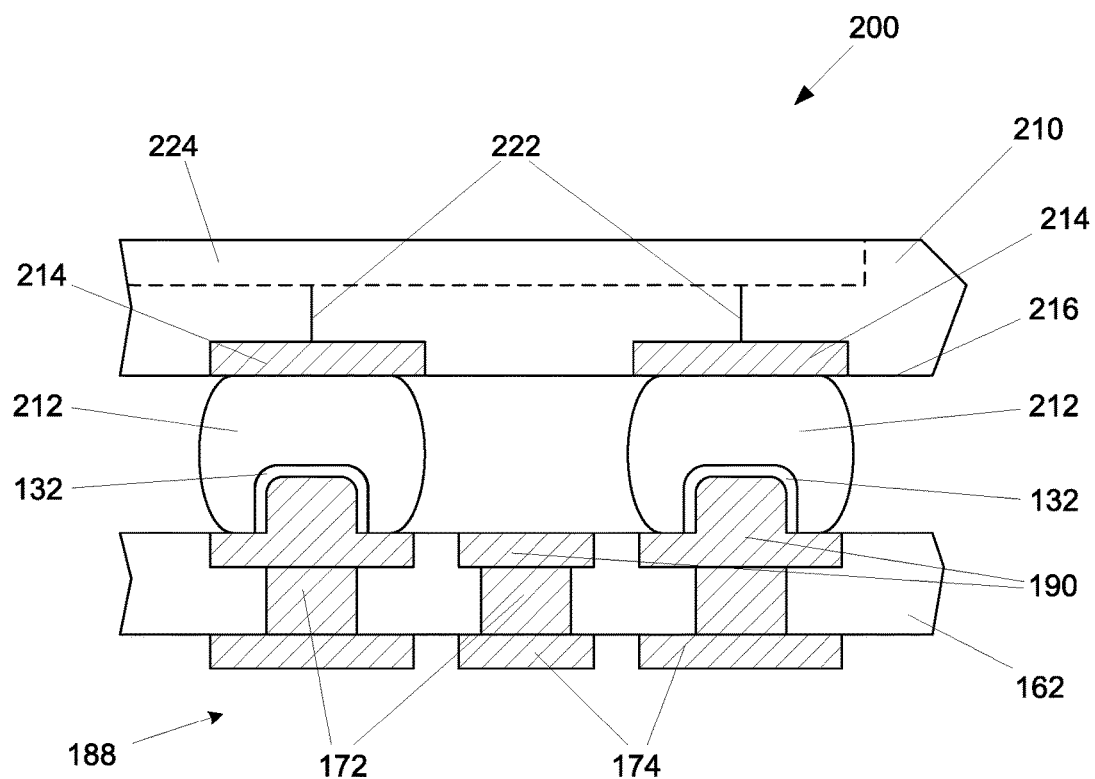
FIG. 11 is a side cross sectional view of a microelectronic device attached to the microelectronic substrate with a solder interconnect, according to an embodiment of the present description.

In the production of microelectronic structures, microelectronic devices are generally mounted on microelectronic substrates that provide electrical communication routes between the microelectronic devices and external components. As shown in FIG. 11, a microelectronic device 210, such as a microprocessor, a chipset, a graphics device, a wireless device, a memory device, an application specific integrated circuit, or the like, attached to at least one of the embedded traces 190 through a solder interconnects 212 in a configuration generally known as a flip-chip or controlled collapse chip connection ("C4") configuration to form a microelectronic structure 200. The solder interconnects 212 may extend from interconnection pads 214 on an active surface 216 of the microelectronic device 210 and the embedded traces 190 of the first microelectronic substrate 182. The microelectronic device interconnection pads 214 may be in electrical communication (shown generally as solid lines 222) with integrated circuitry 224 (demarked with dashed lines) within the microelectronic device 210. As illustrated, the solder interconnects 212 may contact the embedded trace planar portion 192, such that the embedded trace attachment structures 194 extend into their respective solder interconnects 212.

The solder interconnects 212 may be made of any appropriate solder material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. The solder may be reflowed, either by heat, pressure, and/or sonic energy to secure the solder between the respective interconnections pads.

As will be understood to those skilled in the art, having the embedded trace attachment structure 194 may assist in the formation of properly aligned solder interconnects 212 and the higher surface area compared to embedded traces without attachment structures may form more reliable connections.

Further advantages of the fabrication embodiments of the present description may include improved height control with regard to the embedded trace attachment structure 194, as compared to forming an attachment structure after the formation of an embedded trace, because an attachment structure height H (e.g. distance between the embedded trace planar portion first surface 196 and a farthest point 198 therefrom of the attachment structure 194 as shown in FIG. 10) is determined by etching process used to form the recesses 122 (see FIG. 3). Generally, etching processes can provide tighter control than electrolytic plating processes that would be used to form an attachment structure after the formation of an embedded trace.

Additional advantages of the fabrication embodiments of the present description may include improved profile control with regard to the embedded trace attachment structure 194, as compared to forming an attachment structure after the formation of an embedded trace, because the embedded trace attachment structure 194 may be protected by the surface finish 122 during the removal of the dummy layers $102_1$, $102_2$ (see FIGS. 9 and 10), as will be understood to those skilled in the art.

The embodiments of the present description may also allow for selective surface finishes. As described, the surface finish 132 may be formed before the formation of the embedded trace 190 and may be localized on the embedded trace attachment structures 194. This will allow for one or more additional surface finishes to be formed at the end of the fabrication process which may be formed on the surface finish and/or in separate locations from the embedded trace attachment structures 194. This is in contrast to the other known solution where only single surface finish may be possible.

Figure 12:
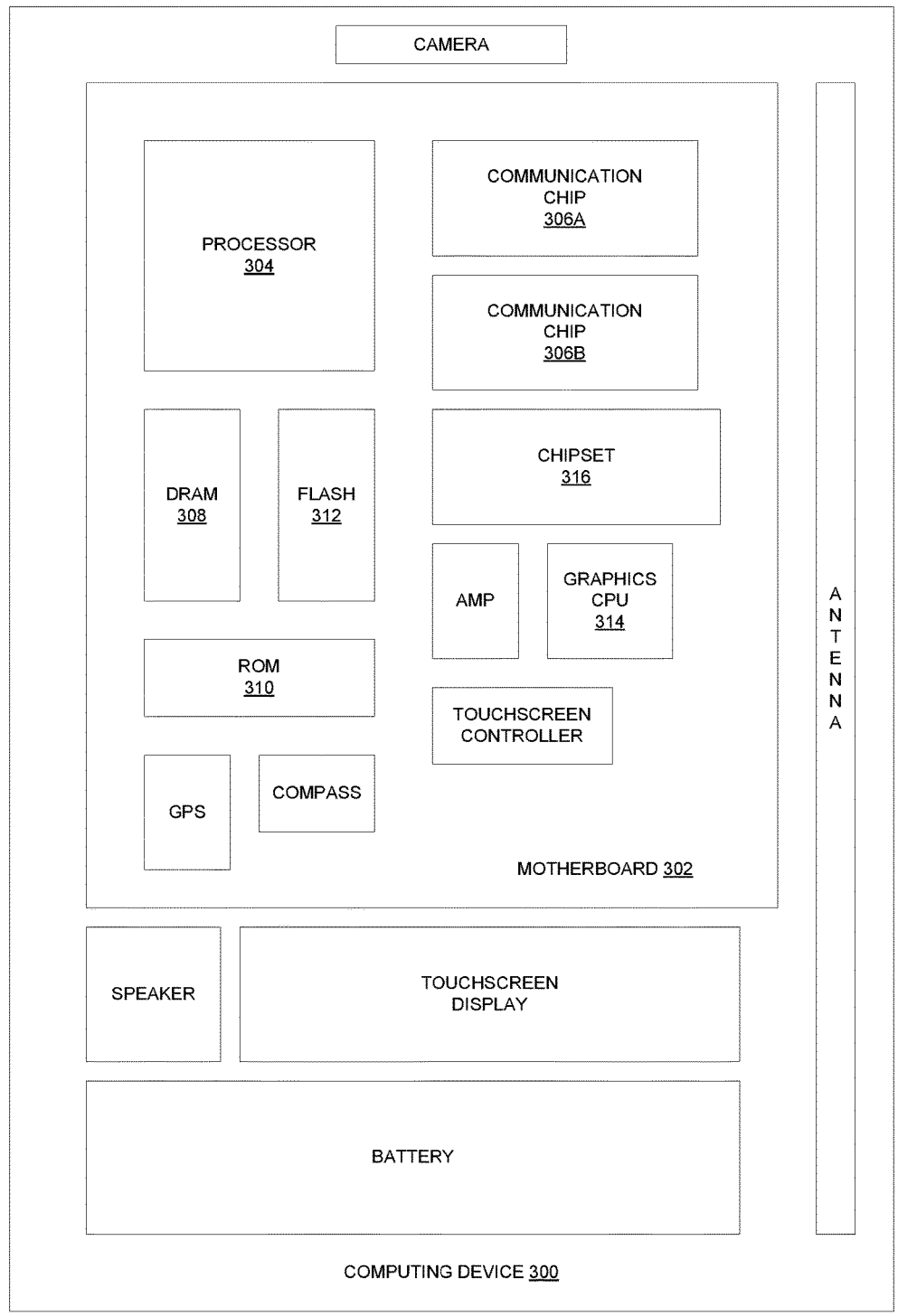
FIG. 12 illustrates a computing device in accordance with one implementation of the present description.

FIG. 12 illustrates a computing device 300 in accordance with one implementation of the present description. The computing device 300 houses a board 302. The board may include a number of microelectronic components, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio code (not shown), a video code (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 300 may include a microelectronic substrate having a embedded trace having an integral attachment structure, as described above.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-12. The subject matter may be applied to other microelectronic device and assembly applications, as will be understood to those skilled in the art.

The following examples pertain to further embodiments, wherein Example 1 is a method of fabricating a microelectronic structure, comprising forming a dummy layer, forming at least one recess in the dummy layer, conformally depositing a surface finish in the at least one recess, forming an embedded trace layer on the dummy layer and abutting the surface finish; and removing the dummy layer.

In Example 2, the subject matter of Example 1 can optionally include forming the recess in the dummy layer comprising forming an etch mask on the dummy layer wherein the etch mask includes openings therethrough, and etching the dummy layer to form the recesses.

In Example 3, the subject matter of Example 2 can optionally include conformally depositing the surface finish through the etch mask.

In Example 4, the subject matter of any of Examples 1 to 3 can optionally include the forming the embedded trace layer comprising forming an embedded trace mask on the dummy metal layer, wherein the embedded trace mask includes openings therethrough, and depositing an embedded trace layer through the embedded trace mask openings.

In Example 5, the subject matter of any of Examples 1 to 4 can optionally include forming a dielectric material layer on the embedded trace layer and the dummy layer.

In Example 6, the subject matter of Example 5 can optionally include forming at least one conductive via through the dielectric material layer to contact the at least one embedded trace and forming at least one conductive trace contacting the conductive via prior to removing the dummy layer.

In Example 7, the subject matter of Example 5 can optionally include forming the embedded trace material layer comprising forming the embedded trace material layer from the same material as the dummy layer.

In Example 8, the subject matter of any of Examples 1 to 7 can optionally include forming the dummy layer comprises forming a dummy metal layer.

In Example 9, the subject matter of Example 8 can optionally include forming the dummy metal layer comprising forming a dummy copper layer.

In Example 10, the subject matter of any of Examples 1 to 9 can optionally include forming the embedded trace layer comprises forming an embedded metal trace layer.

In Example 11, the subject matter of Example 10 can optionally include forming the embedded metal trace layer comprising forming a embedded copper trace layer.

The following examples pertain to further embodiments, wherein Example 12 is a method of fabricating a microelectronic structure, comprising: forming a dummy layer; forming an etch mask on the dummy layer wherein the etch mask includes openings therethrough; etching the dummy layer to form at least one recess; conformally depositing a surface finish in the at least one recess through the etch mask; removing the etch mask; forming an embedded trace mask on the dummy layer, wherein the embedded trace mask includes openings therethrough; depositing an embedded trace layer through the embedded trace mask openings, wherein the embedded trace layer abuts a portion of the dummy layer and the surface finish; and removing the dummy layer.

In Example 13, the subject matter of Example 12 can optionally include forming a dielectric material layer on the embedded trace layer and the dummy layer.

In Example 14, the subject matter of Example 13 can optionally include forming at least one conductive via through the dielectric material layer to contact the at least one embedded trace and forming at least one conductive trace contacting the conductive via prior to removing the dummy layer.

The following examples pertain to further embodiments, wherein Example 15 is a microelectronic structure comprising a dielectric layer having a first surface and an embedded trace in the dielectric layer, wherein the embedded trace comprises a planar portion and an attachment structure that extends above the dielectric layer first surface, and wherein the attachment structure is integral with the planar portion.

In Example 16, the subject matter of Example 15 can optionally include a conductive via through the dielectric material layer contacting the embedded trace and a conductive trace contacting the conductive.

In Example 17, the subject matter of any of Examples 15 to 16 can optionally include a microelectronic device electrically attached to the embedded trace through a solder interconnect, wherein the embedded trace attachment structure extends into the solder interconnect.

In Example 18, the subject matter of any of Examples 15 to 17 can optionally include the embedded trace comprising copper.

The following examples pertain to further embodiments, wherein Example 19 is an electronic system, comprising a board; and a microelectronic structure attached to the board, including a microelectronic substrate comprising a dielectric layer having a first surface and an embedded trace in the dielectric layer, wherein the embedded trace comprises a planar portion and an attachment structure that extends above the dielectric layer first surface, wherein the attachment structure is integral with the planar portion; and a microelectronic device electrically attached to the embedded trace through a solder interconnect, wherein the embedded trace attachment structure extends into the solder interconnect.

In Example 20, the subject matter of Example 19 can optionally include a conductive via through the dielectric material layer contacting the embedded trace; and a conductive trace contacting the conductive via.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure, comprising:
   a dielectric layer having a first surface;
   an embedded trace in the dielectric layer, wherein the embedded trace comprises a planar portion and an attachment structure that extends above the dielectric layer first surface, wherein the attachment structure is integral with the planar portion;
   a conformal surface finish on the embedded trace attachment structure, wherein the conformal surface finish contacts the attachment structure and the planar portion of the embedded trace; and
   a solder interconnect on the embedded trace, wherein the solder interconnect contacts the conformal surface finish and contacts the embedded trace.

2. The microelectronic structure of claim 1, wherein the embedded trace comprises copper.

3. The microelectronic structure of claim 1, wherein the conformal surface finish comprises a material selected from the group consisting of palladium, nickel, and gold.

4. The microelectronic structure of claim 1, further including:
   a conductive via through the dielectric material layer contacting the embedded trace; and
   a conductive trace contacting the conductive via.

5. The microelectronic structure of claim 1, further comprising:
   a microelectronic device having an active surface and an interconnection pad on the active surface; and
   wherein the solder interconnect extends between the interconnect pad of the microelectronic device and the embedded trace, and wherein the solder interconnect contacts the interconnect pad of the microelectronic device and contacts the planar portion of the embedded trace, such that the attachment structure extends into the solder interconnect.

6. The microelectronic structure of claim 5, wherein the solder interconnect is a lead/tin alloy.

7. The microelectronic structure of claim 5, wherein the solder interconnect is a high tin content alloy.

8. An electronic system, comprising:
a board; and
a microelectronic structure attached to the board, including:
- a microelectronic substrate comprising a dielectric layer having a first surface and an embedded trace in the dielectric layer, wherein the embedded trace comprises a planar portion and an attachment structure that extends above the dielectric layer first surface, wherein the attachment structure is integral with the planar portion;
- a conformal surface finish on the embedded trace attachment structure, wherein the conformal surface finish contacts the attachment structure and the planar portion of the embedded trace;
- a solder interconnect on the embedded trace, wherein the solder interconnect contacts the conformal surface finish and contacts the embedded trace; and
- a microelectronic device electrically attached to the embedded trace through the solder interconnect, wherein the embedded trace attachment structure extends into the solder interconnect.

9. The electronic system of claim 8, wherein the embedded trace comprises copper.

10. The electronic system of claim 8, wherein the conformal surface finish comprises a material selected from the group consisting of palladium, nickel, and gold.

11. The electronic system of claim 8, further including:
- a conductive via through the dielectric material layer contacting the embedded trace; and
- a conductive trace contacting the conductive via.

12. The electronic system of claim 8, further comprising:
wherein the microelectronic device has an active surface and an interconnection pad on the active surface; and
wherein the solder interconnect extends between the interconnect pad of the microelectronic device and the embedded trace, wherein the solder interconnect contacts the interconnect pad of the microelectronic device and contacts the planar portion of the embedded trace.

13. The electronic system of claim 12, wherein the solder interconnect is a lead/tin alloy.

14. The electronic system of claim 12, wherein the solder interconnect is a high tin content alloy.

* * * * *